(12) United States Patent
Ouchi

(10) Patent No.: US 6,836,579 B2
(45) Date of Patent: Dec. 28, 2004

(54) SURFACE OPTICAL DEVICE APPARATUS, METHOD OF FABRICATING THE SAME, AND APPARATUS USING THE SAME

(75) Inventor: Toshihiko Ouchi, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/429,805

(22) Filed: May 6, 2003

(65) Prior Publication Data

US 2003/0194168 A1 Oct. 16, 2003

Related U.S. Application Data

(63) Continuation of application No. 09/645,317, filed on Aug. 25, 2000, now abandoned.

(30) Foreign Application Priority Data

Aug. 27, 1999 (JP) ............................... 11-241050

(51) Int. Cl.⁷ .............................. G02B 6/12; G01D 9/42
(52) U.S. Cl. ..................... 385/14; 385/129; 385/130; 385/131; 346/107.1; 346/135.1
(58) Field of Search ..................... 385/14, 129, 130, 385/131, 132, 37; 346/107.1, 135.1

(56) References Cited

U.S. PATENT DOCUMENTS

| | | | | |
|---|---|---|---|---|
| 4,638,335 A | * | 1/1987 | Smith et al. ............. 346/135.1 |
| 5,384,282 A | * | 1/1995 | Shiba et al. .................. 438/59 |
| 5,557,120 A | * | 9/1996 | Martin et al. ............... 257/291 |
| 5,701,325 A | | 12/1997 | Ouchi et al. .................. 372/96 |
| 5,850,408 A | | 12/1998 | Ouchi et al. .................. 372/27 |
| 6,046,096 A | | 4/2000 | Ouchi ........................ 438/510 |
| 6,089,442 A | | 7/2000 | Ouchi et al. ............. 228/180.1 |
| 6,222,868 B1 | | 4/2001 | Ouchi et al. .................. 372/50 |
| 6,261,859 B1 | | 7/2001 | Ouchi ........................ 438/39 |
| 6,477,286 B1 | * | 11/2002 | Ouchi ........................ 385/14 |
| 6,507,594 B1 | | 1/2003 | Furukawa et al. ............. 372/36 |
| 6,611,635 B1 | * | 8/2003 | Yoshimura et al. ........... 385/14 |
| 6,674,948 B2 | * | 1/2004 | Yeh et al. .................... 385/120 |
| 6,731,840 B2 | * | 5/2004 | Worchesky et al. ........... 385/37 |
| 2003/0194168 A1 | * | 10/2003 | Ouchi ........................ 385/14 |

FOREIGN PATENT DOCUMENTS

| | | | |
|---|---|---|---|
| JP | 7-30209 | 1/1995 | ............... 385/14 X |
| JP | 9-223848 | 8/1997 | ............... 385/14 X |

OTHER PUBLICATIONS

A.V. Krishnamoorthy, "Vertical–Cavity Surface–Emitting Lasers Flip–Chip Bonded to Gigabit–per–Seconde CMOS Circuits", IEEE Photonics Technology Letters, vol. 11, No. 1, Jan. 1999.

R. Pu et al., "VCSEL's Bonded Directly to Foundry Fabricated GaAs Smart Pixel Arrays", IEEE Photonics Technology Letters, vol. 9, No. 12, Dec. 1997.

R. Pu et al., "Comparison of techniques for bonding VCSELS directly to ICs", J. Opt A: Pure Appl. Opt 1 (1999).

* cited by examiner

Primary Examiner—Brian M. Healy
(74) Attorney, Agent, or Firm—Fitzpatrick, Cella, Harper & Scinto

(57) ABSTRACT

A surface optical device apparatus includes a surface optical device and a second substrate. The surface optical device includes a functional layer grown on a first substrate, which acts as a supporting substrate for fabricating the functional layer thereon. The first substrate is later thinned or removed, and a first electrode is formed on at least one of surfaces of the functional layer. The surface optical device performs light emission or light reception along a direction approximately perpendicular to the first substrate, and the first electrode has functionality for electrically controlling the light emission or reception. The second substrate includes a second electrode formed thereon, and the surface optical device is bonded to the second substrate with the first electrode and the second electrode in electrical contact with each other.

17 Claims, 14 Drawing Sheets

SURFACE OPTICAL DEVICE APPARATUS, METHOD OF FABRICATING THE SAME, AND APPARATUS USING THE SAME This application is a Continuation of application Ser. No. 09/645,317, filed Aug. 25, 2000, now abandoned, the entire disclosure of which is incorporated herein by reference.

BACKGROUND OF THE INVENTION

1. Field of the Invention

This invention relates to a surface optical device apparatus which can be readily fabricated with good yield and is suitable for use in a structure constructed in a one- or two-dimensional array, its fabrication method, an optoelectronic device in which the surface optical device is integrated together with a Si integrated circuit (Si-IC), an optical wiring device using the surface optical device apparatus, an optical recording apparatus using the surface optical device apparatus, and related structures and devices.

2. Related Background Art

In recent years, the development of surface light emitting devices arranged in two-dimensional arrays has been desired. Among such devices, a vertical cavity surface emitting laser (VCSEL) is strongly expected since its threshold is low (approximately 1 mA), its power consumption is small, and it can be easily arrayed. Moreover, when a VCSEL is integrated with a Si-IC, the VCSEL can be speedily driven, and the device can be presented in a small package. Accordingly, such a structure can be advantageously applied to signal transmission between Si-IC's, to optical recording on a recording medium, and similar uses.

There are several methods of integrating an optical device and a Si-IC. In one method, an optical device is bonded to a Si substrate wherein Si-IC has been formed. In another method, a Si-IC and an optical device are integrated in a hybrid manner on a supporting substrate, such as a Si substrate, a printed circuit board (PCB), or a ceramic substrate.

As an example of the former method, there exists, as disclosed in Japanese Patent Application Laid-Open No. 9(1997)-223848, a method in which an epitaxial growth surface of a laser radiating layer is bonded to a Si-IC via a polyimide adhesive, and a GaAs growth substrate, on which the laser radiating layer had been grown, is removed by etching to obtain a surface emitting laser. FIG. 1 illustrates a cross section of this structure. An electrode of the surface emitting laser 100B fabricated by the above process is connected to an electrode 200A on the Si-IC substrate 200 via electrical wiring 400. Another electrode 100D is connected to a wiring pattern formed on the insulating layer 300 of polyimide. In such a structure, no alignment is needed between the optical device and the Si-IC. Further, additional processing, such as photolithography, can be conducted even after the integration, since only a functional layer of the optical device without its growth substrate is arranged on the Si and a step of the surface is hence small (about 5 μm). In FIG. 1, a light receiving device 100A, an electrode 100C of the device 100A and a layer 1000 of optical devices are illustrated as well.

As an example of the latter method, there exists, as disclosed in Japanese Patent Application Laid-Open No. 7(1995)-30209, a method in which a semiconductor substrate of an optical device is removed, the optical device in chip form is bonded to a film or the like, and the optical device is aligned with an electrode of an electronic circuit substrate and implemented in a flip-chip manner. FIGS. 2A to 2H illustrate the fabrication steps according to this method. After a functional layer 1106 is epitaxially grown on the semiconductor substrate 1101 as illustrated in FIG. 2A, an electrode 1109 for driving the optical device 1111 is formed as illustrated in FIG. 2B. The devices 1111 are then separated as illustrated in FIG. 2C, and the semiconductor substrate 1101 is removed by etching as illustrated in FIG. 2D. The devices 1111 are bonded to an extensible film 1114 as illustrated in FIG. 2E, and the film 1114 is extended to obtain chips of the optical device 1111 with only the functional layer 1106 as illustrated in FIG. 2F. The optical device 1111 is affixed at a desired area of an electronic circuit board 1117 with a pressing jig 1116. Thus, an optoelectronic multi-chip-module (MCM), in which the optical device 1111 is placed on the electronic circuit substrate 1117 in a hybrid integration manner, as illustrated in FIG. 2H, can be obtained. In FIGS. 2A to 2H, there are also illustrated a buffer layer 1102, a lower mirror 1103, an active layer 1104, an upper mirror 1105, an anode 1107, a cathode 1108. a mesa groove 1110, a separating groove 1112, a protective layer 1113, a spacing 1115, and an electrical wiring 1118.

There are significant problems with the structure disclosed in Japanese Patent Application Laid-Open No. 9(1997)-223848, however. Its thermal radiation characteristic is poor, and its luminary characteristics, such as light radiation efficiency and light output, are inferior to those of ordinary implementation structures, since the polyimide layer 300 is interposed between the optical devices 100A and 100B and the Si substrate 200. Further, since the fabrication process of the optical devices 100A and 100B is performed only after the functional layers of the optical devices are transferred to the Si substrate 200, limitations on the freedom of the process (i.e., on processing temperature, plasma processing, and the like) arise, due to concerns with preventing damage to the IC. Accordingly, the configurations of the optical devices 100A and 100B are also restricted.

Concerning the structure of Japanese Patent Application Laid-Open No. 7(1995)-30209, its mechanical strength is low due to a small thickness (ordinarily about 5 μm) of the functional layer 1106 without the substrate, though its thermal conductivity is good due to direct bonding between the electrodes. Accordingly, its handling is difficult, and its performance characteristics are likely to be decreased due to the introduction of crystallographic defects therein, and the like. Furthermore, two electrodes must be aligned for each device since the electric contact should be established on the side of the circuit board 1117 only. Therefore, high alignment precision is required, and costs increase accordingly.

SUMMARY OF THE INVENTION

It is an object of the present invention to provide an apparatus with a surface optical device, in which characteristics of the surface optical device are not decreased with the integration of the surface optical device and the electronic device, where no high precision of alignment is required at the time of implementation, and whose productivity is high. It is a further object of the present invention to provide a method of fabricating such an apparatus, as well as other apparatuses which use such an apparatus, such as an optoelectronic MCM, an optical wiring apparatus and an optical recording apparatus, and related structures and methods.

The present invention is generally directed to a surface optical device apparatus including a surface optical device, and a second substrate. The surface optical device includes a functional layer grown on a first substrate, which acts as a supporting substrate needed for fabricating the functional layer thereon, with the first substrate being later thinned or removed, and a first electrode formed on at least one of the surfaces of the functional layer. The surface optical device emits or receives light in a direction approximately perpendicular to the first substrate, and the first electrode has a function for electrically controlling the light emission or reception. The second substrate includes a second electrode formed thereon, and the surface optical device is bonded to the second substrate with the first electrode and the second electrode being in electrical contact with each other. In the apparatus of this invention, the first substrate is removed or thinned by etching or the like after the optical device is bonded to the second substrate, such as a Si substrate or a circuit substrate, with the first and second electrodes electrically connected, and another electrode is led from a surface of the optical device exposed after the first substrate is removed or thinned. Accordingly, the thermal characteristic of the surface optical device is improved due to the close proximity of the second substrate to an active layer of the optical device, and thus, no high alignment precision is required at the time of bonding the optical device. Further, the first substrate still remains after the optical device has been bonded, so that the optical device can be readily handled without damaging the functional layer.

The following more specific structures are possible in the above structure.

The second substrate may further include first electrical wiring, electrically connected to the second electrode.

A plurality of surface optical devices may be arranged on the second substrate, and the second substrate may further include second electrical wiring for independently driving and controlling the surface optical devices. In this case, the first electrode may be formed on the surface of the functional layer on a side opposite to the side of the first substrate, as a common electrode, the plurality of the surface optical devices may be separated from each other, a third electrode may be formed on each surface optical device on the side of the first substrate, and the second electrical wiring may be connected to the third electrode. Further, in this case, the second electrical wiring may be formed on an insulating layer formed on the surface optical device on the side of a third electrode, and a contact hole for electrically connecting the third electrode to the second electrical wiring, and a window for transmitting light, may be formed in the insulating layer. Thus, the optical devices can be independently driven and controlled, and an array of surface optical devices can be obtained with high productivity without diminishing the characteristics of the optical devices.

A plurality of the surface optical devices may be arranged on the second substrate, the surface optical devices may be separated from each other, a third electrode may be formed on each surface optical device on a side opposite to the first electrode, the second substrate may further include first electrical wiring electrically connected to the second electrode, and second electrical wiring electrically connected to the third electrode, and the first electrical wiring and the second electrical wiring may construct a wiring matrix for independently driving and controlling the surface optical devices. Thus, a two-dimensional array of surface optical devices can be obtained with high productivity without diminishing the characteristics of the optical devices. In this case also, the second electrical wiring way be formed on an insulating layer formed on the surface optical device on the side of the third electrode, and a contact hole for electrically connecting the third electrode to the second electrical wiring, as well as a window for transmitting light, may be formed in the insulating layer.

The surface optical device is typically a surface emitting laser with the functional layer including an active layer and distributed Bragg reflector (DBR) mirror layers sandwiching the active layer.

The present invention is also directed to an optoelectronic multi-chip module (MCM) including a surface optical device, a second substrate, and an integrated circuit for driving and controlling the surface optical device. The surface optical device and the second substrate are constructed as described above in connection with the surface optical device of this invention. The integrated circuit, such as a bare chip of a Si-IC, is provided on the second substrate, and electrically connected to the surface optical device through the second electrode. Thereby, the IC and optical device can be integrated in a compact structure, and an electrical signal can be converted into an optical signal.

The integrated circuit, as described, may be a bare chip of a Si integrated circuit which is implemented on the second substrate in a flip-chip manner. Thereby, an optoelectronic MCM with high productivity can be obtained.

The second substrate may be a Si substrate, and the integrated circuit may be a Si integrated circuit which is fabricated in the Si substrate.

The present invention is also directed to an optical wiring device in which an optical waveguide medium, such as an optical fiber, is fixed to the surface of the surface optical device of an optoelectronic MCM of this invention to perform optical transmission and reception through the medium of the optical waveguide. The optical waveguide medium is perpendicularly fixed to the surface of the surface optical device with a resin adhesive. Thereby, a high-speed optical wiring device with low electromagnetic radiation emission noise (EMI) can be obtained at a low cost by using the MCM of this invention.

The present invention is further directed to a multi-layer optoelectronic multi-chip module (MCM) including a plurality of optoelectronic multi-chip modules and an inter-layer insulating layer which is flattened and provided between the respective optoelectronic multi-chip modules, such that transmission and reception of optical signals can be performed between such optoelectronic multi-chip modules. Thereby, a high-performance optoelectronic MCM capable of performing fast processing can be obtained by stacking a plurality of MCM's with integrated surface optical device and electronic device.

The present invention is also directed to a multi-layer optoelectronic multi-chip module including a plurality of the optoelectronic multi-chip modules of this invention in which the second substrate is an insulating thin film, and an inter-layer insulating layer which is provided between the respective optoelectronic multi-chip modules, such that transmission and reception of an optical signal can be performed between the optoelectronic multi-chip modules. Thereby, a high-performance multi-layer optoelectronic MCM, capable of performing fast processing, can be obtained.

The present invention is also directed to an optical recording apparatus which includes a light source from the optoelectronic MCM of this invention, and a control unit for controlling the light source to perform recording on an optical recording medium with a plurality of laser beams from the light source. Thereby, a high-performance laser beam printer, a CD-ROM apparatus, an optomagnetic disc apparatus, and the like, can be thus obtained.

The present invention is also directed to a method of fabricating a surface optical device apparatus, which including the steps of:

(a) forming a surface optical device functional layer on a first substrate;

(b) processing the shape, and a first electrode, of the surface optical device;

(c) forming a second electrode on a second substrate;

(d) bonding the surface optical device to the second substrate with the first electrode being aligned with the second electrode; and (e) removing or thinning the first substrate such that substantially only the functional layer is transferred to the second substrate.

When a plurality of such surface optical devices are arranged, the method may further include the steps of:

(f) removing the functional layer between a plurality of the surface optical devices to separate the respective surface optical devices from each other;

(g) forming a third electrode on each surface optical device;

(h) forming an insulating layer on the transferred functional layer;

(i) forming a first hole for establishing an electrode contact, and a second hole for transmitting light, in the insulating layer; and (j) forming electrical wiring, electrically connected to the third electrode through the first hole, on the insulating layer and on the second substrate.

According to such a method, a process for integrating the surface optical device and an electronic device can be achieved with high productivity and high yield.

The present invention is also directed to a method of fabricating a surface optical device apparatus, which includes the steps of:

(a) forming a surface optical device functional layer on a first substrate;

(b) processing the shape of the surface optical device;

(c) removing the functional layer between a plurality of the surface optical devices to separate the respective surface optical devices from each other;

(d) forming a first electrode of the surface optical device;

(e) forming a second electrode on a second substrate;

(f) bonding the surface optical devices to the second substrate with the first electrode being aligned with the second electrode;

(g) removing or thinning the first substrate such that substantially only the functional layer is transferred to the second substrate;

(h) forming a third electrode on the transferred functional layer;

(i) forming an insulating layer on the transferred functional layer;

(j) forming a first hole for establishing an electrode contact, and a second hole for transmitting light, in the insulating layer; and (k) forming electrical wiring, electrically connected to the third electrode through the first hole, on the insulating layer and on the second substrate.

Further, according to such a method, a process for integrating the surface optical device and an electronic device can be achieved with high productivity and high yield.

The present invention is also directed to a method of fabricating a surface optical device apparatus, including the steps of:

(a) forming a functional layer of the surface optical device on a first substrate;

(b) processing the shape of the surface optical device;

(c) removing the functional layer between a plurality of the surface optical devices to separate the respective surface optical devices from each other;

(d) forming a first electrode of the surface optical device;

(e) bonding a surface of the functional layer to a third substrate;

(f) removing or thinning the first substrate such that substantially only the functional layer is left;

(g) forming a third electrode on an exposed surface of the functional layer;

(h) forming a second electrode on a second substrate;

(i) bonding the surface optical devices to the second substrate with the third electrode being aligned with the second electrode;

(j) removing the third substrate such that only the functional layer is substantially transferred to the second substrate;

(k) forming an insulating layer on the transferred functional layer;

(l) forming a first hole for establishing an electrode contact, and a second hole for transmitting light in the insulating layer; and (m) forming electrical wiring, electrically connected to the third electrode through the first hole, on the insulating layer and the second substrate.

According to such a method, a process for integrating the surface optical device with the electronic device can be achieved with high productivity and yield.

Each of the above methods may further include a step of forming an etching stop layer for selective etching between the first substrate and the functional layer, and the first substrate may be removed by etching which is then stopped at the etching stop layer. In this case, the method may further include a step of removing the etching stop layer after the first substrate is removed.

The present invention is also directed to a method of fabricating a plurality of optoelectronic multi-chip-modules in a collective manner, which includes the steps of:

(a) forming a functional layer of the surface optical device on a first substrate;

(b) forming a plurality of electrodes on a plurality of areas, respectively, on a second substrate;

(c) bonding at least a surface optical device, such as an array of surface optical devices, which is cut out from the first substrate with the functional layer of the surface optical device, to each such area on the second substrate;

(d) collectively removing or thinning the first substrate on the second substrate such that substantially only the functional layer remains on each area of the second substrate;

(e) forming electrical wiring on each such area of the second substrate;

(f) implementing an integrated circuit, such a Si-IC, on each area of the second substrate; and (g) dicing the second substrate such that the respective areas of the second substrate are separated from each other.

According to this method, a plurality of the optoelectronic MCM's can be collectively fabricated by a single process, and productivity can be improved.

These advantages, as well as others will be more readily understood in connection with the following detailed description of the preferred embodiments of the invention in connection with the drawings.

DESCRIPTION OF THE PREFERRED EMBODIMENTS (First Embodiment)

Figure 3:
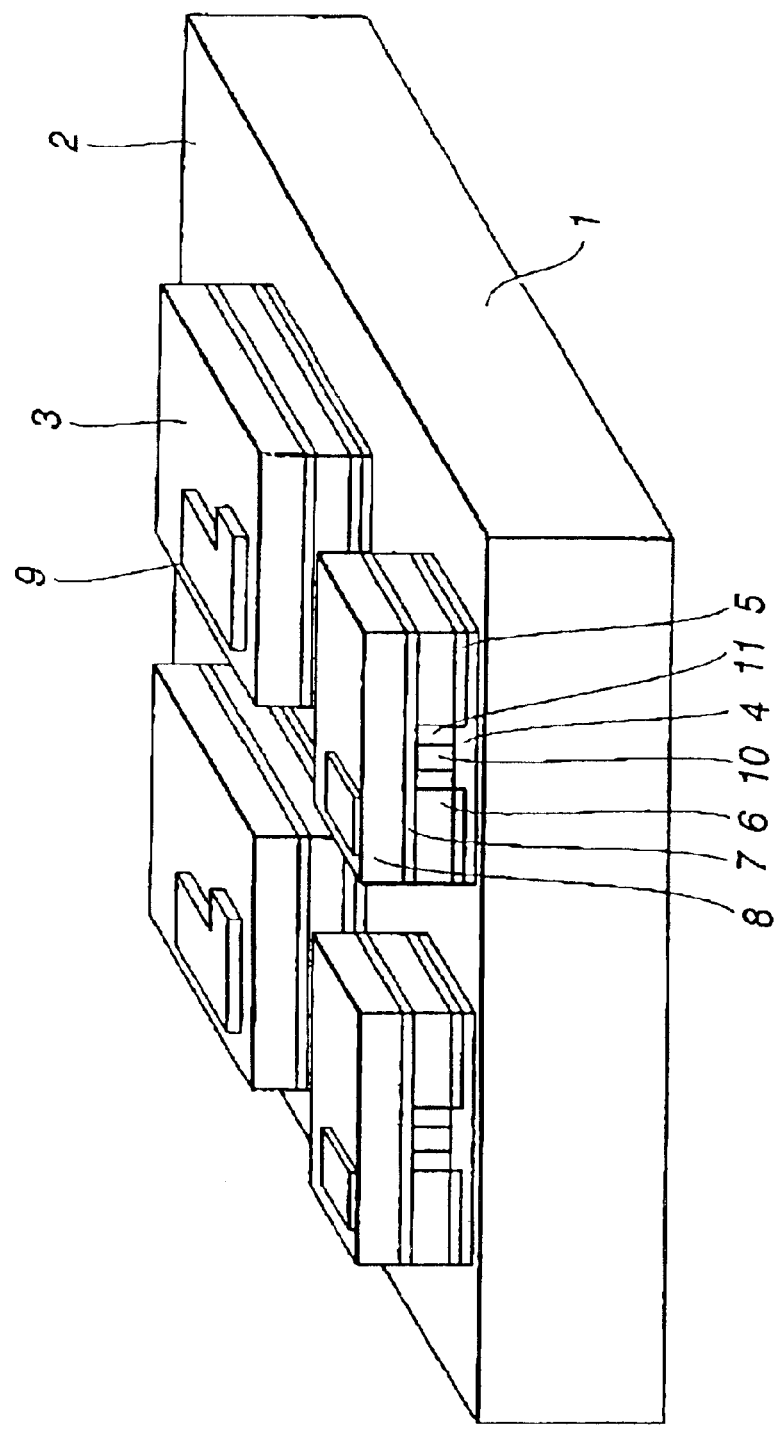
FIG. 3 is a perspective view of a first embodiment of an array of surface emitting lasers according to the present invention.

The first embodiment of the present invention is directed to a structure in which a surface emitting laser is used as the surface emitting device, and only its functional layer, including a light radiating layer and a mirror layer, is transferred to a ceramic substrate of AlN or the like having good thermal conductivity. FIG. 3 illustrates a perspective view of such a structure. In FIG. 3, the functional layer between the surface optical devices is completely removed.

An electrode 2 of Ti/Pt/Au is formed on an appropriate place of an AlN ceramic substrate 1 on which a surface emitting laser 3 is implemented, and this electrode 2 serves as a common electrode. A Ti/Pt/Au electrode 4 formed as a p-side electrode of the surface emitting laser 3 is thermally connected to the common electrode 2 with an Au/Sn solder (not shown) disposed on an appropriate portion of the electrode 2. Besides the solder formed by evaporation or plating, connection may be carried out by using a solder ball, an electrically-conductive adhesive, or a pressure joint between electrodes made of Au.

The surface emitting laser 3 includes an insulating layer 5, a distributed Bragg reflector (DBR) layer 6 comprised of alternate multiple layers of two kinds of p-AlGaAs semiconductors (where their Al mole fractions, such as, e.g., 0.1 and 0.9, lie in a range between 1 and 0.1), a one-wavelength cavity layer 7 consisting of a multiple quantum well active layer of AlGaAs/GaAs sandwiched by AlGaAs spacer layers, a DBR layer 8 of n-AlGaAs multiple layers, and an n-side electrode 9 of an AuGe/Au layer. A highly-doped layer of GaAs (not shown) is formed at the interface with the electrode to improve the electrode contact. A layer (not shown) of $SiN_x$, or the like, may be formed, as a passibation layer, on the uppermost surface of the n-side with a thickness such that no influence of reflection is created. A light radiation portion 10 has a cylindrical shape with a diameter of 15 μm, and an annular recess on the side of the p-DBR mirror 6 is filled with a ployimide 11 for current constriction.

The surface emitting laser 3 is processed after the functional layer is epitaxially grown on an n-GaAs growth substrate, and the GaAs substrate is removed after the p-side electrode 4 is bonded on the ceramic substrate 1 as described above.

As methods for forming the current constriction structure, there are, beside the above-discussed method, a selective oxidization method in which only a high Al-mole-fraction layer of the p-DBR layer 10 is laterally oxidized to create an $Al_xO_y$ portion, as well as a method in which an insulating layer is formed around the functional layer by proton injection. Further, an implementation method of this embodiment as illustrated in FIG. 4A can be utilized even where the optical device 3 has a p-side with an uneven, i.e. nonflat, post-type surface.

Figure 9:
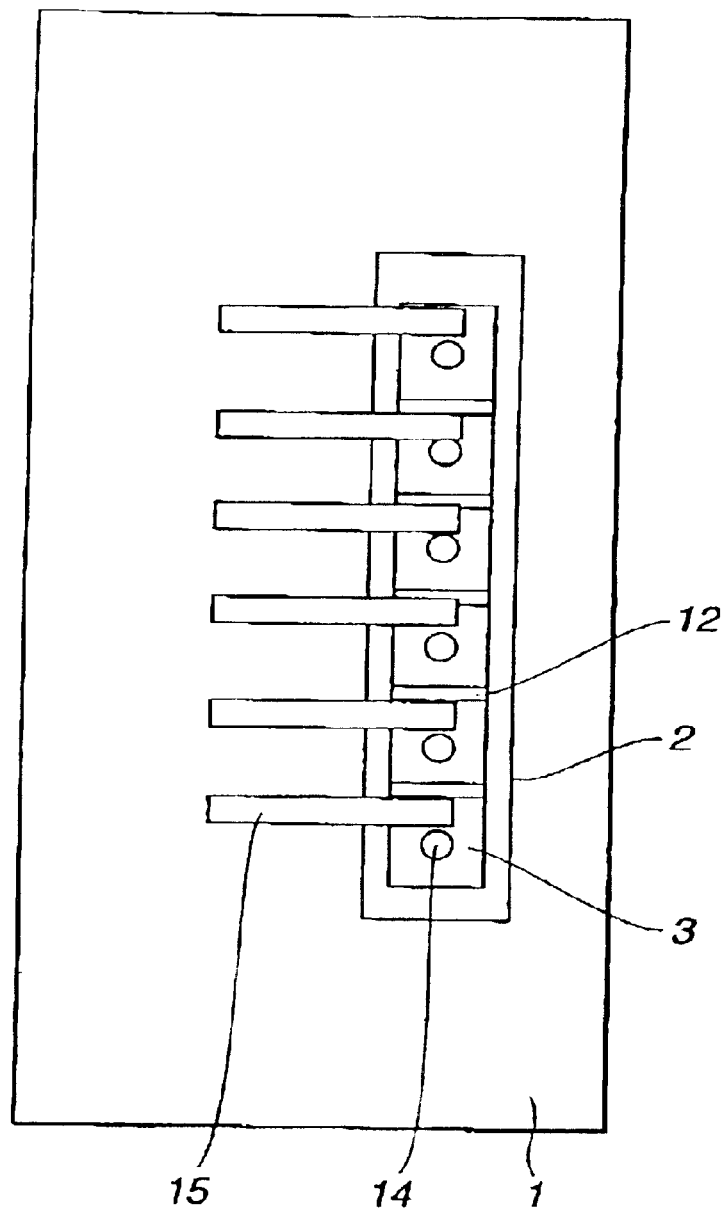
FIG. 9 is a plan view of a one-dimensional array of surface emitting lasers according to the present invention.

In FIG. 3, four surface emitting lasers 3 are shown arranged in a two-dimensional array, but naturally the number of the lasers 3 is not limited to this number. In FIG. 3, two surface emitting lasers on the front side are shown partly cut along cross sections. The lasers 3 can also be arranged in a one-dimensional array as illustrated in FIG. 9, for example. In this case, since electrical wiring from another surface emitting laser is not physically proximate to the surface emitting laser 3, an insulating layer of polyimide need not be formed on the GaAs surface. Only an insulating layer such as indicated by reference numeral 19 in FIG. 4A needs to be formed on an end surface of the optical device 3, so that the electrical wiring is insulated from the electrode 2 on the AlN substrate 1. A separating groove is preferably formed between the devices 3 as illustrated in FIG. 3. The separating groove may be filled with polyimide, or the like, to level the surface. The n-side electrode 9 as illustrated in FIG. 3 has an L-shape such that light from the light radiating region 10 can be emitted from this side. The n-side electrode, however, can have various shapes. The electrode may be formed on the entire surface with a window for transmitting light being formed therein, for example.

In the above structure, each surface emitting laser 3 has a size of 150 μm×150 μm, and the pitch between the devices 3 is 250 μm. The size and the pitch, of course, are also not limited to these numbers.

Figure 4A:
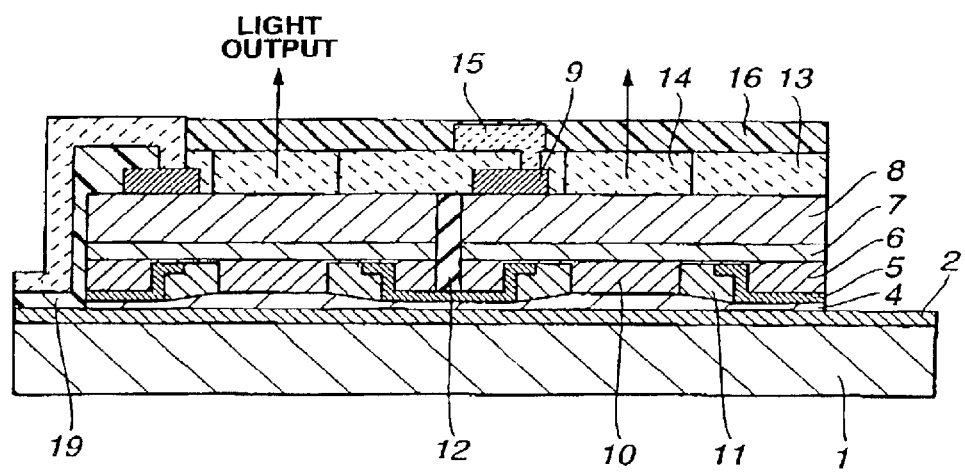
FIG. 4A is a cross-sectional view of an optoelectronic MCM according to the present invention.
Figure 4B:
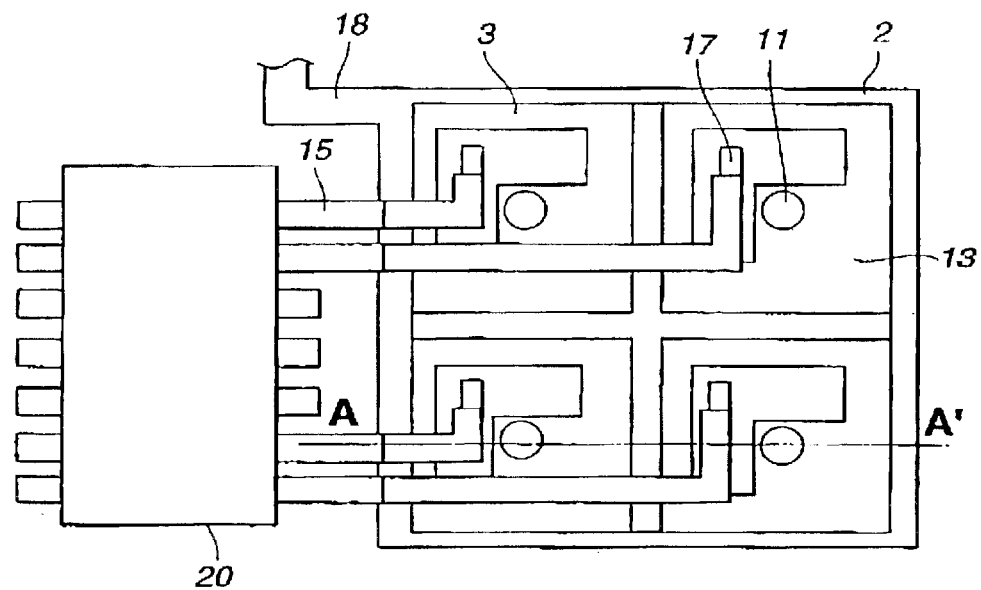
FIG. 4B is a plan view of the optoelectronic MCM according to the present invention.

The electric wiring of the n-side electrode 9 and the manner of connection to the Si-IC 20 are illustrated in FIGS. 4A and 4B. FIG. 4A illustrates a portion of the surface emitting laser, and is a cross-sectional view taken along the line A–A' shown in FIG. 4B. In FIGS. 4A and 4B, identical elements and structures to those shown in FIG. 3 are indicated by the same reference numerals.

The surface emitting laser 3 has a structure as discussed above, and a separating groove between devices is filled with a polyimide 12. A photosensitive polyimide 13, as an insulating layer, is formed on the uppermost surface of the laser, and windows 14 and holes 17 are alternately formed in light emitting and electrode contact portions of the insulating layer 13, respectively, by patterning. The electrode contact is established through the hole 17, and the electrical connection is provided to the ceramic substrate 1 through electrical wiring 15. In FIG. 4A, reference numeral 16 designates another electrical wiring provided on the rear side of the figure. Polyimide 19 is also formed on the side wall of the surface emitting laser 3 by self-alignment during a process of polyimide patterning on the surface to establish side wall insulation. More specifically, after the polyimide is entirely coated over the device surface, the polyimide is caused to remain on the side wall in the self-alignment manner when etching is performed using $O_2$ plasma or the like.

As illustrated in FIG. 4B, a Si-IC bare chip 20 for driving the surface emitting laser with logic signals is implemented on the ceramic substrate 1 in a flip-chip manner. The bare chip 20 is connected to the surface emitting laser 3 via electrical wiring 15 of Ti/Au. The p-side common electrode 2 of the surface emitting laser 3 is connected to a power source via electrical wiring 18 on the substrate 1.

Thus, an MCM can be completed by forming the optical device 3 and the Si-IC 20 on a common substrate 1. Since the growth substrate of the optical device 3 is removed and the device 3 is thinned, electrical wiring 15 and 16 can be formed by surface processing such as via photolithography. Accordingly, there is no need to employ a wire bonding which is inferior in yield, compactness and speed of signal transmission to the electrical wiring described above.

Figure 1:
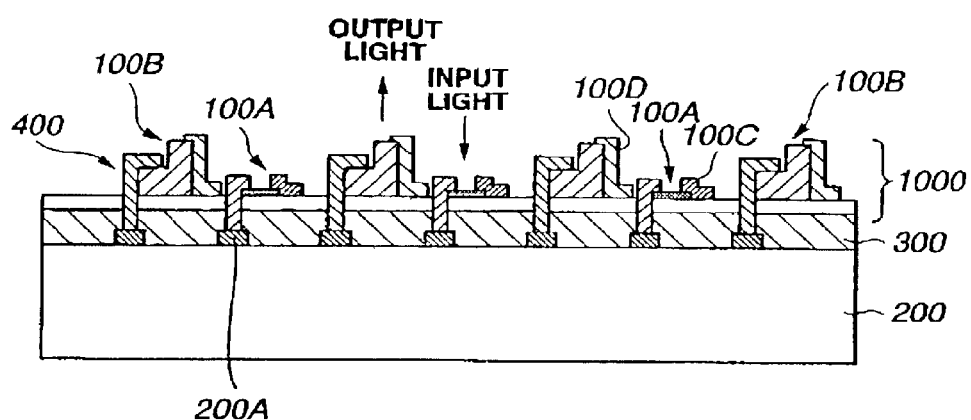
FIG. 1 is a cross-sectional view of a prior art array of surface emitting lasers with transferred functional layers.
Figure 2A:
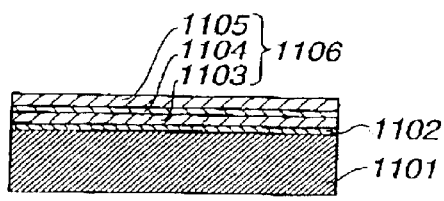
FIGS. 2A to 2H are cross-sectional views illustrating a prior art method of fabricating an optical device with a transferred functional layer.
Figure 2D:
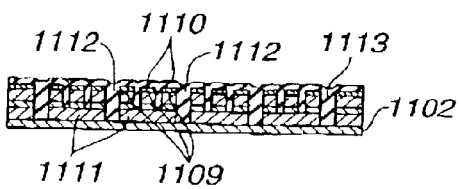
Figure 2B:
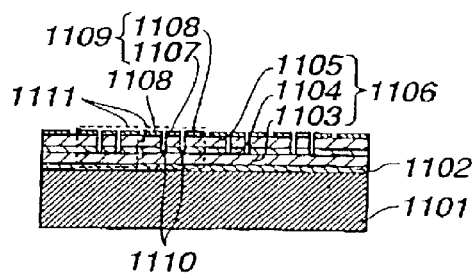
Figure 2C:
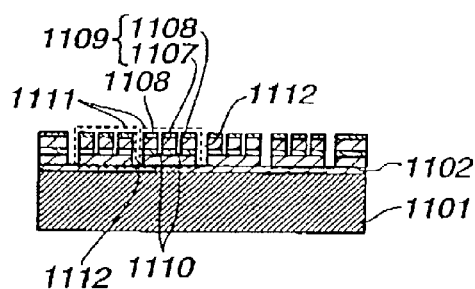
Figure 2E:
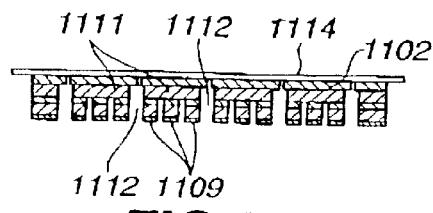
Figure 2F:
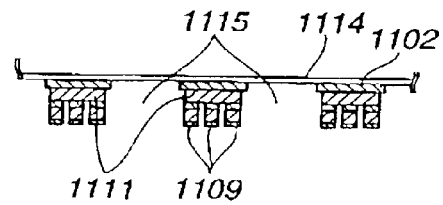
Figure 2G:
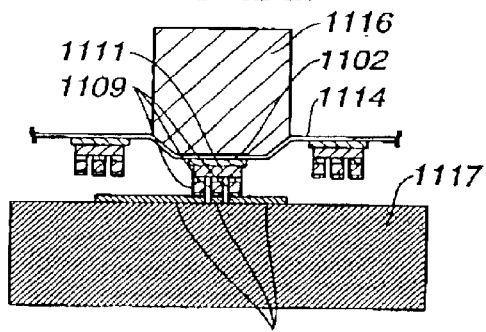
Figure 2H:
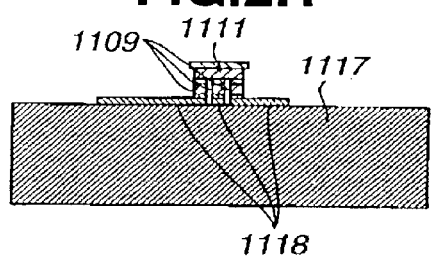

In the structure of this embodiment, the fabrication process of the surface emitting laser 3 is accomplished on a compound semiconductor substrate (growth substrate), so that no complicated process is required after the functional layer is transferred to the common substrate 1. Accordingly, processing conditions of the laser, such as limitations on mechanical strength and heating, can be better tolerated, as compared with the structure of FIG. 1. Further, yield is improved since no alignment precision is required when the device 3 is bonded on the ceramic substrate 1. Due to the electrodes 2 and 4 being directly bonded to each other, thermal conductivity is excellent, and the characteristics of the surface emitting laser 3 are thus improved. Furthermore, since the p-side electrode 4 is common, i.e., the device can be driven in a common-anode manner, an n-p-n transistor or an n-channel MOC-IC, advantageous due to its high-speed driving capabilities, can be used as the driver IC 20.

In the structure of this embodiment, the contact area of the p-side electrode 4, whose contact resistance is potentially liable to increase, can be enlarged, and therefore, the device resistance can be reduced. Thus, the device characteristics, such as thermal characteristic and output power, can be improved. Although the ceramic substrate is used as the implementation substrate 1 in the above-discussed structure, a Si substrate, a metal substrate, a printed circuit board of glass-epoxy series, or the like can be used as well. If necessary, insulation can be disposed between the devices 3 by forming an insulating layer on the substrate surface, for example.

Figure 5A:
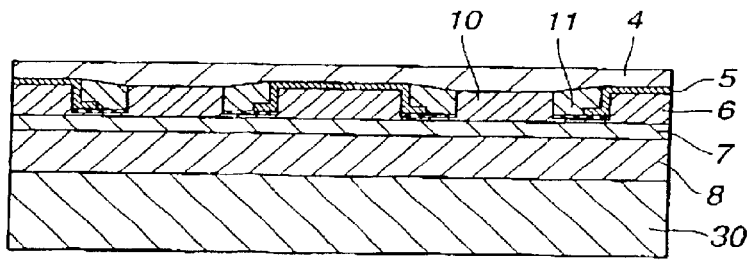
FIGS. 5A to 5D are cross-sectional views illustrating a method of fabricating an array of surface emitting lasers according to the present invention.

A fabrication process of the above-discussed structure will be next described with reference to FIGS. 5A to 5D. As illustrated in FIG. 5A, an n-GaAs substrate, an n-AlAs etching stop layer, an n-GaAs contact layer (these three layers are not shown), the DBR mirror layer 8 of n-AlAs/AlGaAs multiple layers, the active layer 7 having a thickness of one-wavelength in which undoped AlGaAs/GaAs triple quantum wells are sandwiched by AlGaAs spacer layers, the DBR layer 6 of p-AlAs/AlGaAs multiple layers, and the p-GaAs contact layer (not shown) are epitaxially grown on an n-GaAs substrate 30 by using, for example, a metal organic-chemical vapor deposition (MOCVD). An annular recess is then formed by etching down to the active layer 7 to form the light radiating region 10. The etched portion is filled with polyimide 11 to level the surface. The common p-side electrode 4, made of Ti/Pt/Au, is formed on the entire surface.

Figure 5B:
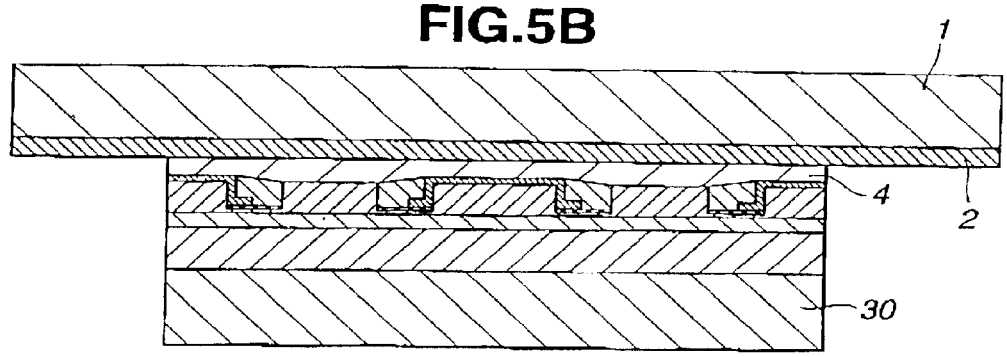

As illustrated in FIG. 5B, the common electrode 2, made of Ti/Pt/Au, is formed on the AlN substrate 1, and the Au/Sn solder (not shown) is formed on a region, on which the surface emitting laser 3 is to be bonded (see FIG. 5C), by evaporation, for example. The common electrode 2 and the common p-side electrode 4 are bonded by pressing and heating.

Figure 5C:
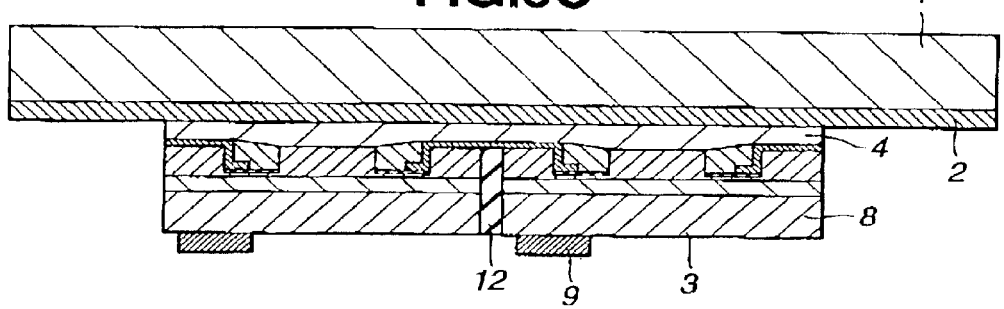

As illustrated in FIG. 5C, etching is conducted down to the AlAs etching stop layer using a mixture solution of $H_2O_2$ and $NH_3$ to remove the GaAs substrate 30 on the laser side. The AlAs etching stop layer is etched by HCl to expose the GaAs contact layer. Then, after the separating groove is formed between the devices 3 and filled with the polyimide 12, the n-side electrode 9 of AuGe/Au is formed. Annealing at 400° C. may be performed for about two minutes to improve the electrode contact. This process also serves as a reflow process of the Au/Sn solder in bonding the AlN substrate 1 to the surface emitting laser 3.

Figure 5D:
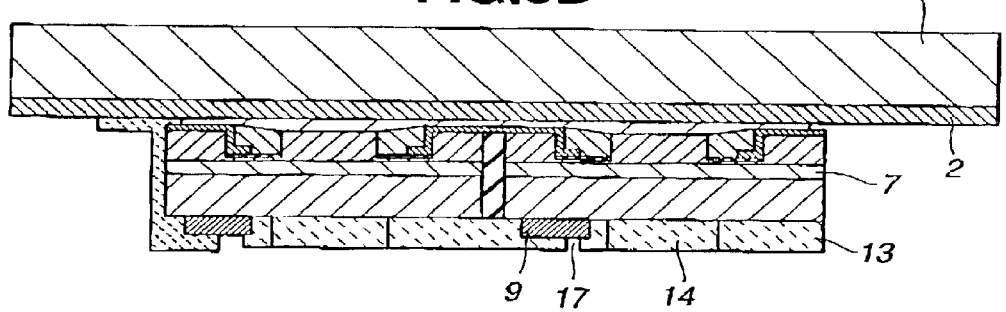

As illustrated in FIG. 5D, the n-GaAs surface is covered with the photosensitive polyimide 13 to form the electrical wiring, and polyimide covering the light transmission window 14 and the contact hole 17 is removed by patterning. Then, the wiring pattern 15, as shown in FIG. 4B, for connecting the n-side electrode 9 to the IC 20 through the contact hole 17 is formed, and the Si-IC 20 is implemented on the substrate 1 in a flip-chip manner.

In the above-discussed process, the part of the process occurring after the transfer of the functional layer to the substrate 1 is somewhat complicated since the separation of the devices 3 is performed after the removal of the growth substrate. Therefore, alternatively, the separation of the devices 3 can be conducted prior to the removal of the growth substrate. The fabrication process using this method is illustrated in FIGS. 6A to 6C.

Figure 6A:
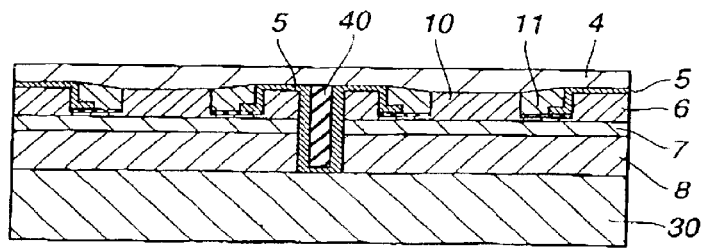
FIGS. 6A to 6C are cross-sectional views illustrating another method of fabricating an array of surface emitting lasers according to the present invention.
Figure 6B:
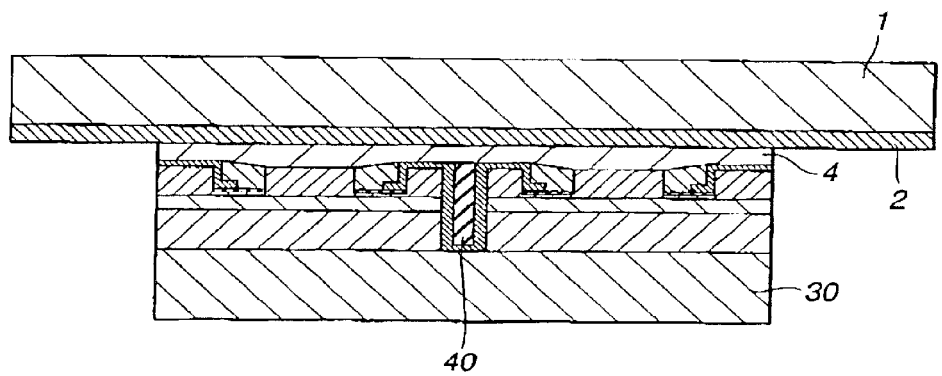
Figure 6C:
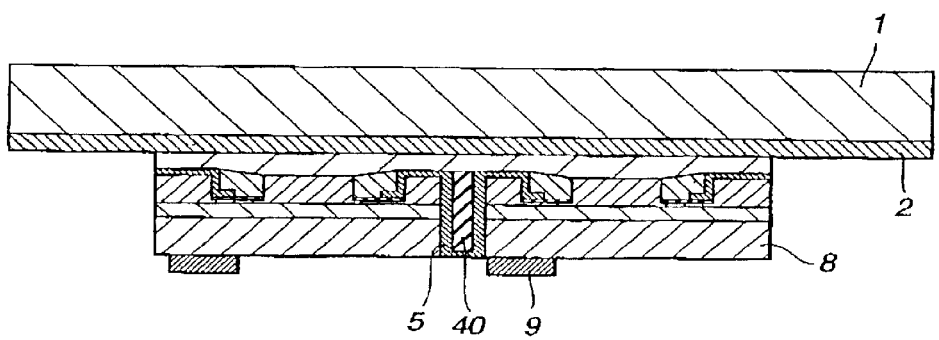

In FIG. 6A, the surface emitting laser is fabricated as in the case of FIG. 5A. However, a separating groove 40 down to the substrate 30 is formed prior to formation of the p-side electrode 4, and the insulating layer 5 and the polyimide 11 are then deposited. As is illustrated in FIG. 6B, the wafer is bonded to the AlN substrate 1, and then, as illustrated in FIG. 6C, the GaAs substrate 30 is removed by etching. The etching is stopped at a state in which the insulating layer 5 formed on the separating groove 40 is exposed. In this case, the separation between the devices 3 has been completed just after the substrate 30 is removed. Consequently, the process after the removal of the substrate 30 can be simplified.

The substrate 30 is removed by etching in the above-described process, but the substrate 30 can also be thinned by etching and polishing, or by polishing only. The GaAs substrate 30 is polished to a thickness of about 1 μm by chemical mechanical polishing (CMP), for example, and the electrode 9 is formed on the polished surface. In this case, the above-mentioned AlAs etching stop layer and the GaAs contact layer need not be formed, and the n-side electrode 9 can be formed directly on the surface of the thinned GaAs substrate 30.

A tape automated bonding (TAB) tape can be used, making the above-described process of the electrical wiring unnecessary. More specifically, electrical wiring is formed on a thin film substrate, such as a polyimide film, and an electrode pad is formed at an area, where electrical contact with the electrode 9 of the laser is needed, on a surface of the thin film substrate opposite to its surface containing the electrical wiring, by a through-hole. The electrode pad is then aligned with and bonded to the electrode 9 of the surface emitting laser. The structure as illustrated in FIGS. 4A and 4B is thus fabricated. In such case, a hole is formed in the polyimide film for a translucent window.

In the foregoing, a surface emitting laser of 0.85-$\mu$m band has been described, but devices of other materials and wavelength bands, such as an InP-series structure of 1.3-$\mu$m band or 1.55-$\mu$m band, a red-band structure with an active layer of InGaAlP, an ultraviolet to blue-band structure using GaN series, or the like, can also be employed. Further, a surface light emitting diode (LED) and an organic electroluminescence (EL) device can also be used.

In the foregoing, the Si-IC is flip-chip implemented in a hybrid manner, but a structure can be likewise adopted, in which a substrate with a Si-IC is used as the substrate 1 illustrated in FIG. 3 and the optical device 3 is then simply transferred on a substrate region beyond the Si-IC. In this case, The region where the Si-IC is fabricated, corresponds to a portion indicated by reference numeral 20 in FIG. 4B.

(Second Embodiment)

Figure 8:
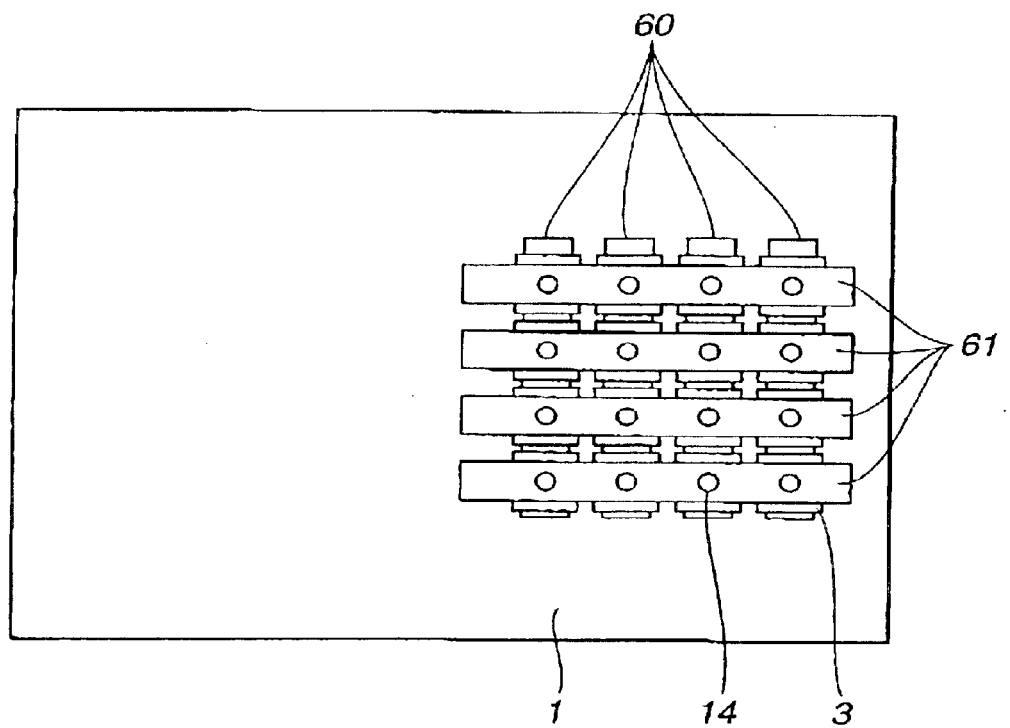
FIG. 8 is a plan view of an array of surface emitting lasers with a wiring matrix according to the present invention.

The second embodiment of the present invention is directed to a structure in which an electrode pattern is formed as a common electrode on an implementation substrate 1, and a thinned functional layer of a surface emitting laser 3 is simply aligned with and implemented on the implementation substrate 1. Where the number of devices 3 in an array increases, a wiring matrix as illustrated in FIG. 8 is advantageous in simplifying the structure of the electrical wiring. Therefore, the common electrode on the implementation substrate 1 is separated into a plurality of stripe-shaped portions.

The structure of the surface emitting laser 3 is similar to that of FIG. 3. An electrode pattern 60 of plural lines is formed on the AlN substrate 1 as illustrated in FIG. 8, and the functional layer of the surface emitting laser 3 is transferred onto the stripe-shaped electrode pattern 60 as in the first embodiment. The p-side electrodes of the devices 3 are separated from each other. An electrode pattern 61 formed on the surface of the GaAs substrate is also shaped into stripe-shaped electrodes as illustrated in FIG. 8.

Figure 7A:
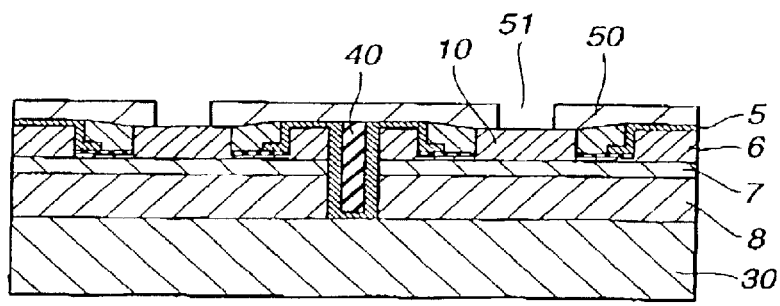
FIGS. 7A to 7C are cross-sectional views illustrating yet another method of fabricating an array of surface emitting lasers according to the present invention.
Figure 7B:
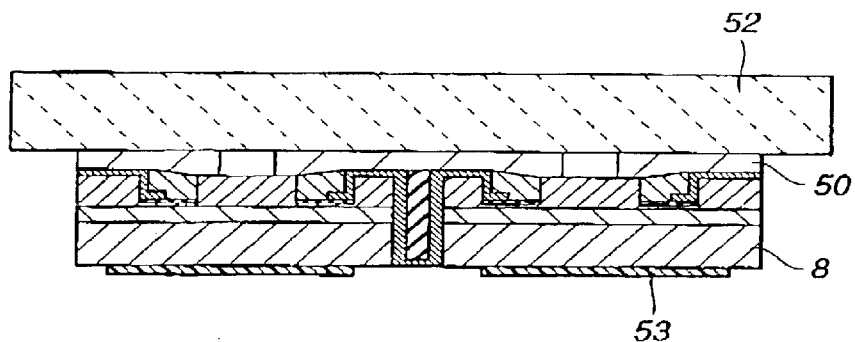
Figure 7C:
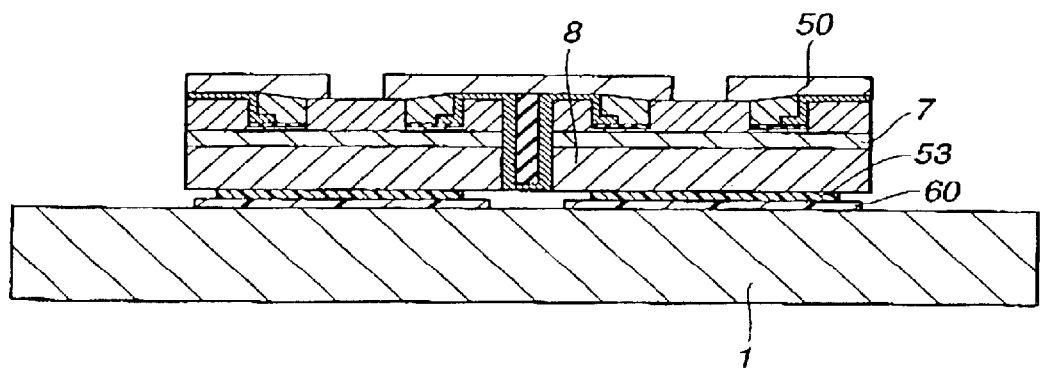

The wiring matrix structure can be formed by a process as illustrated in FIGS. 7A to 7C. In FIG. 7A, the surface emitting laser is fabricated similarly as in the first embodiment, but a window 51 for passing light is opened in a p-side electrode 50 in this case. As illustrated in FIG. 7B, the p-side is bonded to a quartz glass plate 52 with electron wax or the like, the GaAs substrate 30 is then removed, and an n-side electrode 53 is formed. Here, devices 3 are already separated at a stage of the fabrication step of FIG. 7A, so that the electrode separation can be achieved by forming the electrode 53 at an area corresponding to each device.

In FIG. 7C, the electrode pattern 60 of stripe-shaped electrodes is formed on the AlN substrate 1 as illustrated in FIG. 8. The positional alignment between the electrode pattern 60 and the surface emitting laser 3 can be easily achieved when observation is conducted through the glass substrate 52 using a microscope or the like. Thus, the electrode 53 is aligned with, and bonded to, the electrode pattern 60 in a similar fashion as in the first embodiment. The glass substrate 52, used as a supporting substrate, can be readily separated by heating. The wax can be completely removed by washing the wafer with xylene.

After that, the stripe-shaped electrodes 61 as illustrated in FIG. 8 are formed in a similar fashion, as in the first embodiment. The electrode 61 is in contact with the exposed p-side electrode 50. The electric wiring matrix can be thus fabricated.

In the second embodiment with the wiring matrix, the n-side electrode can be implemented on the circuit substrate since the common electrode concept is not implemented. When the side of the n-side electrode is bonded, the fall of thermal characteristics due to the current constriction layer of polyimide 11 can be structurally prevented. As can be seen from FIG. 7C, only the AlAs/GaAs layer 8 of a single crystal exists in a portion between the active layer 7 and the substrate 1, so that thermal conductivity is good and the thermal characteristic of the device is thus improved in the second embodiment.

(Third Embodiment)

In the above embodiments, the process of fabricating an MCM is described. However, it is desirable that a collective process be carried out on a wafer to improve the productivity.

Figure 10:
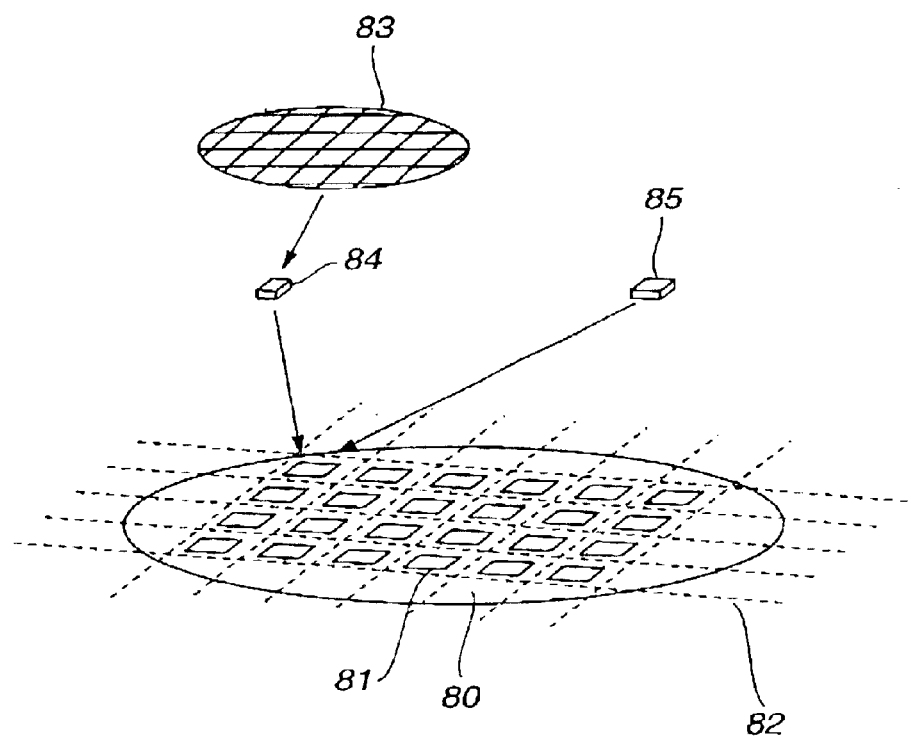
FIG. 10 is a perspective view illustrating a third embodiment of the method of fabricating an optoelectronic MCM on a level wafer according to the present invention.

FIG. 10 illustrates this collective processing manner. In the third embodiment, a relatively inexpensive Si substrate is used. Regions 81, on which the device is implemented, are arranged in a two-dimensional array at predetermined intervals on the Si substrate 80. Electrodes are initially formed on the regions 81 on the wafer of the Si substrate 80 as in the first or second embodiment, a necessary number of arrays of surface emitting lasers 84 are cut out from a GaAs substrate 83, and the arrays of the surface emitting lasers 84 are implemented on the electrodes by a die-bonding apparatus, respectively. When the electrodes are formed by lithography, the electrodes can be arrayed with the precision of a photomask, and the device array 84 can be precisely implemented by the die-bonding apparatus, using pattern alignment. Therefore, a mask alignment process is possible after such implementation.

The GaAs substrates of the surface emitting lasers 84 are collectively removed by etching on the wafer level. It is here preferable to protect the non-etching regions and the end portions of the lasers by a resist such that they are not damaged. Then, again using a photolithography process, patterning by photosensitive polyimide and formation of electrical wiring are conducted as in the first or second embodiment. Herein, the GaAs substrate is etched, and the thickness of the functional layer of the surface emitting laser left on the Si substrate 80 is approximately 5 $\mu$m. Thus, a collective surface process using photolithography can be employed.

Si-IC's 85 are then implemented on the necessary portions of the fabricated electrical wiring, respectively. The collective substrate of MCM's is thus completed. Individual MCM's can be finally obtained by dicing the Si substrate 80 along the dotted lines 82 as inidicated in FIG. 10. An optoelectronic MCM can thus be achieved at low cost by utilizing the above-discussed steps.

The Si substrate 80 used in this embodiment is a semi-insulating substrate which can maintain an insulative characteristic between the devices, but an ordinary Si substrate can be used as well. In this case, an insulating layer is formed on a region where insulation is needed (for example, a region where the Si-IC is implemented). Further, an insulating ceramic substrate of AlN or the like can also be used, as in the first embodiment.

(Fourth Embodiment)

Figure 11:
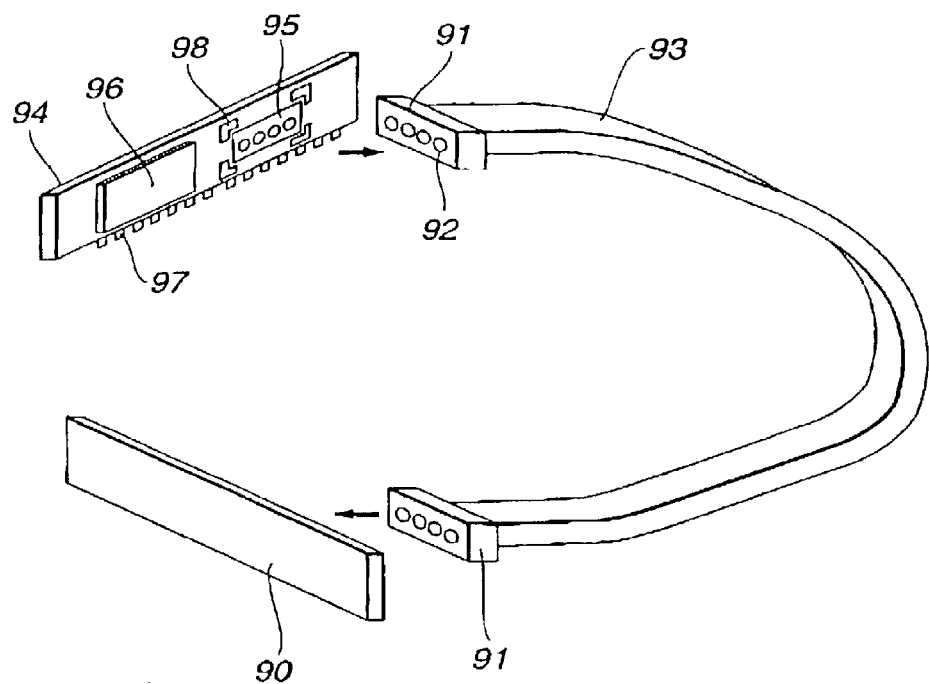
FIG. 11 is a perspective view illustrating a fourth embodiment of an optical wiring device using an optoelectronic MCM according to the present invention.

The fourth embodiment of the present invention is directed to an optical wiring apparatus which uses an MCM with a transferred functional layer. In FIG. 11, an array of surface emitting lasers 95 and a Si-IC 96 are implemented on the MCM 94, in a similar manner as in the first embodiment. The end of a ribbon fiber 93 of four bundled optical fibers is fixed by a member 91, and the member 91 is aligned with, and is directly bonded to, the output surfaces of the surface emitting lasers 95 with an ultra-violet (UV) curable resin. Holes 92 for equidistantly fixing the optical fibers are formed in the member 91. After the fibers has been fixed to the holes 92, the member 91 and the ends of the optical fibers are simultaneously polished so as to create a flat surface. The member 91 can be made of glass, resin, Si, or the like. Further, the optical fiber may be a quartz fiber, or a plastic optical fiber (POF) which requires no alignment precision and is suitable for use in a short-distance transmission. In particular, POF with a core of all-fluoridated polyimide is used in this embodiment. The POF is usable in a wide wavelength range of 0.6 $\mu$m to 1.3 $\mu$m.

An MCM 90 includes a surface light receiving device implemented in place of the surface emitting laser. Similarly constructed as described above, the light receiving device is directly bonded to the member 91 for fixing the end of the ribbon fiber 93, with resin. The light receiving device may be a p-i-n type, a metal-semiconductor-metal (MSM) type, or the like. As its material, any one of GaAs series, Si series, InGaAs series and the like can be selected, depending on signal speed and wavelength band.

The MCM's 90 and 94 can be connected to a mother board by any of (i) removable connection using connector pins 97, (ii) soldering, (iii) flip-chip implementation, or the like. This optical wiring device can be used to connect the boards in an electronic apparatus. In the case of a short distance transmission, a film of arrayed optical waveguides made of resin may be used in place of the optical fiber. As for the alignment, an alignment mark 98 is formed on the substrate of the MCM 94, and a low-cost optical implementation can be achieved by a passive alignment (in which alignment is conducted while the optical device is not being driven). Further, there can be performed a method in which metal layers are formed on the MCM 90 or 94 and the member 91 for fixing the ends of the arrayed optical fibers, and the bonding is conducted in a self-alignment manner using solder balls, or a method in which a guide member is fixed to a position of the alignment mark.

(Fifth Embodiment)

Figure 12:
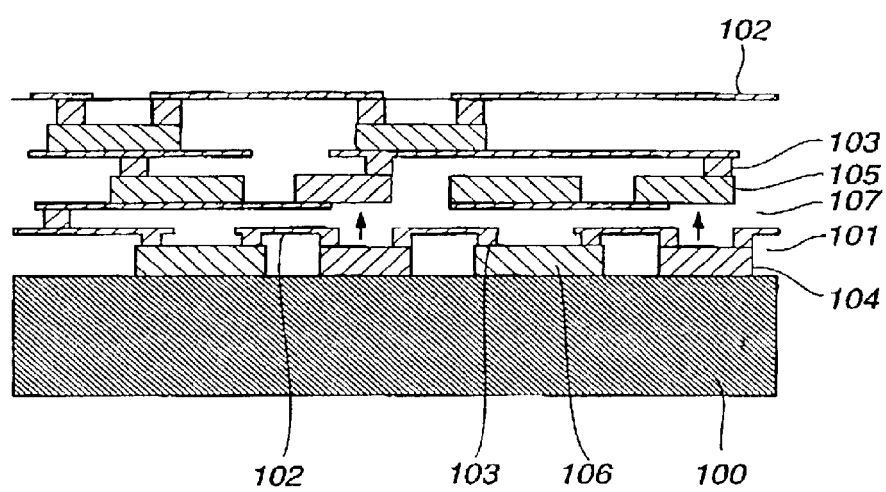
FIG. 12 is a cross-sectional view of a fifth embodiment of a multi-layer optoelectronic MCM according to the present invention.

The fifth embodiment of the present invention is directed to a structure in which MCM's with transferred functional layers are three-dimensionally stacked as illustrated in FIG. 12.

A Si substrate 100 with an insulating layer formed on its surface is used as a base substrate. A Si-IC bare chip 106 and a surface emitting laser 104 are implemented on the substrate 100 as in the first embodiment, as a first-stage layer. The entire surface is covered with an insulating material 101 to flatten the surface. Contact holes for electrical wiring are then formed, and electrode material 103 is used to fill in these holes. Electrical wiring 102 is formed on the insulating layer 101. Herein, only the functional layer (a thickness of about 5 $\mu$m) of the surface emitting laser 104 with the GaAs substrate removed is implemented, as in the first embodiment. Corresponding thereto, the Si-IC 106 is thinned to about 5 $\mu$m by CMP, and implemented. In such case, the following implementation may be conducted. The surface of the Si-IC 106 is set upward, the Si substrate is thinned by polishing, and the polished surface is then die-bonded to the substrate 100. The contact is thus electrically connected to the electrical wiring 102 through the filled electrode material 103.

When the Si-IC 106 is flip-chip implemented with its electrode surface set downward, CMP can be collectively performed in a state wherein the Si-IC 106 and the surface emitting laser 104 are implemented.

Second-stage and third-stage layers are similarly formed. Here, the structure is stacked after an inter-layer insulating layer 107 is formed. Polyimide, PSG, or the like is usually used as the insulating layer 107, but an alamido resin may also be used to make the thermal expansion coefficients closer to each other. In the second-stage layer, a light receiving device 105 is implemented, and this device 105 receives optical signals from the surface emitting laser 104 in the first-stage layer. Thus, signal connection between layers of the multi-layer wiring is achieved using light. At the same time, electrical inter-layer connection can also be employed using the downward protruding electrode 103, as is illustrated in an upper portion (between the second layer and the third layer) of FIG. 12. In this case, the optical connection is preferably used at portions where high-speed transmission or inter-layer insulation is required.

In FIG. 12, the layer, where the surface emitting laser 104 is implemented, is shown as separate from the layer where the light receiving device 105 is implemented. Those devices, however, may alternatively be implemented in the same layer.

As a method of fabricating such a three-dimensional MCM, a method, in which respective layers are separately formed and these layers are then stacked, can be used. This fabrication method will next be described with reference to FIG. 13.

A surface emitting laser 111, a light receiving device 112 and a Si-IC 113 are implemented on an AlN film 110 (a thin layer of resin containing AlN), for example, as in the first embodiment. The surface is flattened by a coverage with an insulating layer 114, and a wiring pattern is fabricated by forming contact holes on the surface (the wiring is omitted in FIG. 13). The wiring pattern may be formed on the AlN film 110 beforehand. The semiconductor devices 111 and 112 are thinned by CMP as discussed above.

Holes 116 are bored by etching, laser-abrasion, or the like, at places where an inter-layer connection (either optical or electrical) is needed. The electrode material is put in the hole 116 at a place where an electrical connection is needed.

When the insulating film is formed of a material transparent to a wavelength of light, no holes are needed for the optical connection. Further, where all connections are optically conducted, no holes are needed. The fabrication process is thus facilitated, and costs can be reduced.

Figure 13:
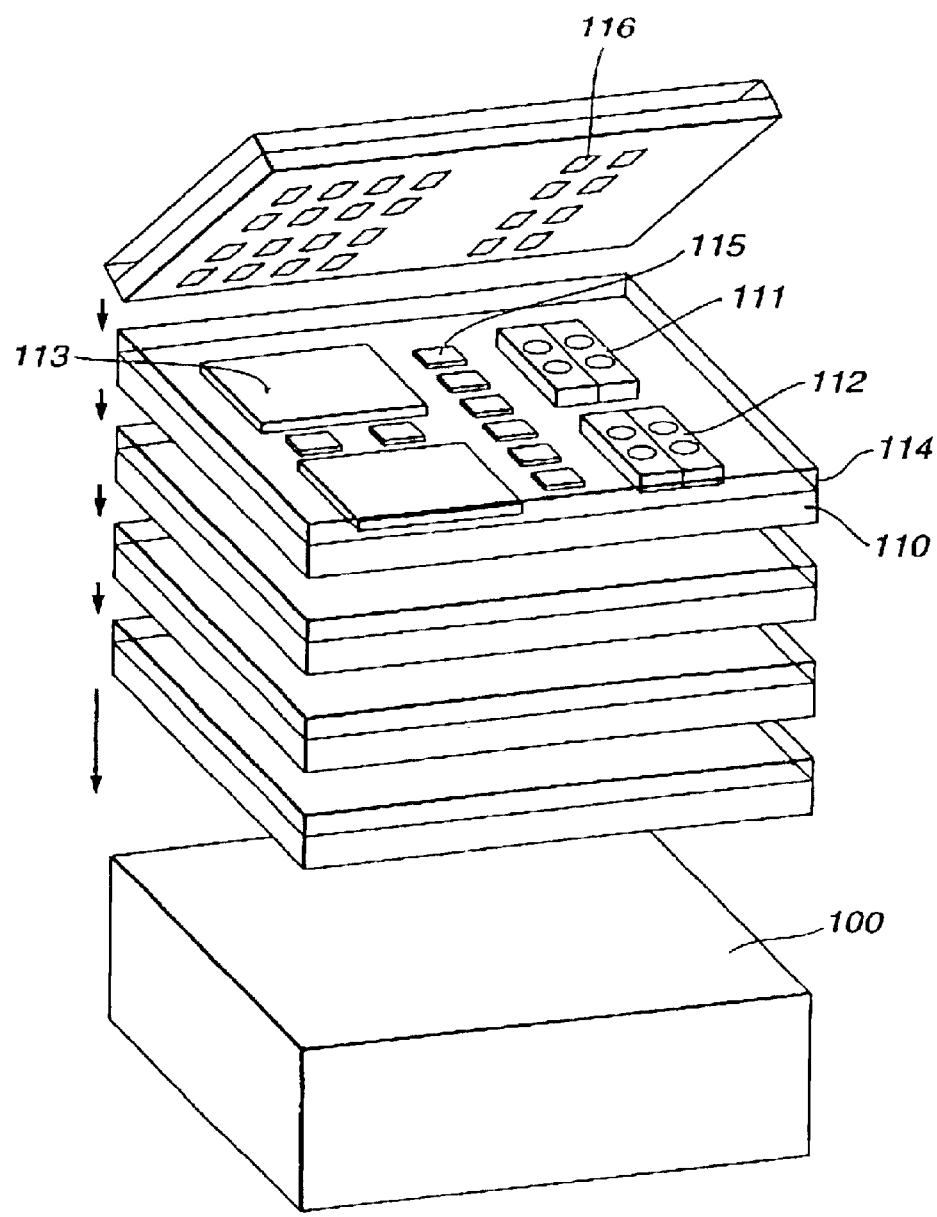
FIG. 13 is a disassembled perspective view illustrating a multi-layer optoelectronic MCM according to the present invention.

Implementation of L, C and R passive elements are indispensable for the purpose of constructing a module having a function such as a daughter board. A layer for implementing these passive devices may be provided in the multi-layer wiring board, or these devices may be implemented on an uppermost layer. As illustrated in FIG. 13, thin passive elements 115 with approximately the same thickness (5 μm) as that of the thinned semiconductor device may be implemented on the common layer.

After implementation is completed on each layer, the layers are stacked on the base substrate 100 and the AlN films 110 are bonded by heating and pressing. The three-dimensional MCM can be thus fabricated. Besides the AlN film 110, a film of polyimide, alamido resin, or the like may be used. Further, after each layer is implemented on a base substrate of Si, or the like, as illustrated in FIGS. 4A and 4B, each base substrate may be thinned by polishing and may be stacked.

The three-dimensional MCM using light for inter-layer connection can be functioned as a compact high-speed electronic functional device, or as a mother or daughter board itself which composes part of an electronic apparatus. Further, since electromagnetic-wave noises radiated from the board can be reduced by using optical connections, the costs of noise abatement or avoidance can be reduced. In particular, the described MCM is effectively used in compact portable equipment, such as portable phones, mobile equipment, notebook-sized personal computers, digital cameras, and camera recorders.

(Sixth Embodiment)

Figure 14:
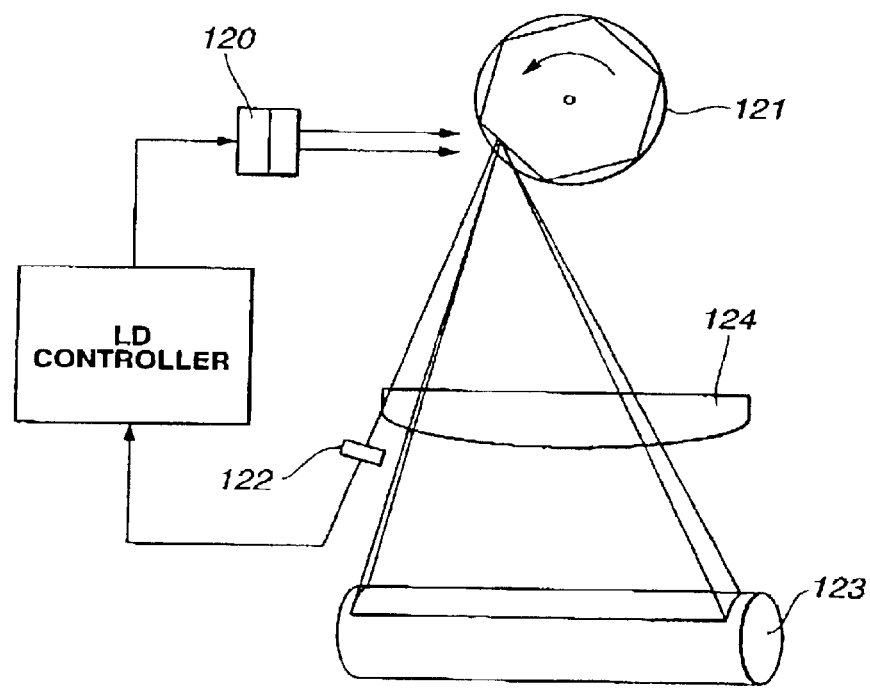
FIG. 14 is a view illustrating a laser beam printer using an optoelectronic MCM according to the present invention.

The sixth embodiment of the present invention is directed to a laser beam printer in which an array of the above-discussed surface emitting lasers is used. FIG. 14 illustrates its schematic structure.

When an optoelectronic MCM 120 with a laser array of the present invention is used as a light source (the array is arranged in an extending direction of a rotary axis of a polygonal mirror 121, i.e., a direction perpendicular to a drawing sheet or an auxiliary scanning direction), a plurality of optical writings in a band form can be carried out on a photosensitive drum 123 during a single scan, as is illustrated in FIG. 14. Printing can be thus achieved at a very high speed. The pitch between beams on the photosensitive drum 123 can be set to a desired amount by a lens system 124. For example, a pitch of 20 μm on the photosensitive drum 123 can be obtained by using the array with a pitch of 125 μm between surface emitting lasers. A one-dimensional array of eight surface emitting lasers or the like can be more readily used than the two-dimensional array. In this embodiment, a laser of 0.77 μm band is used. In FIG. 14, there is also provided an optical receiver 122, used for adjusting timing.

Though there is a limit to the number of revolutions of the polygonal mirror 121, a high-speed laser beam printer can be readily achieved by using the above optoelectronic MCM 120 with the integrated Si-IC of the present invention.

Further, where an array of end-facet emitting lasers is used, a large amount of injection current is needed, and hence power requirements increase. In contrast, when the array of surface emitting lasers of this invention is employed, power requirements can be reduced drastically (i.e., to about a tenth of that of a conventional apparatus). The reason therefor is that the surface emitting laser can be driven with about 10 mA while the driving current for the end-facet emitting laser is about 50 mA. When the number of lasers in the array is increased, for example, to about 1200 pixels, a high-speed laser beam printer, in which the optoelectronic MCM is scanned without the polygonal mirror, can be achieved.

The surface optical device of this invention can be likewise used as a light source in CD-ROM systems, magneto-optical disc systems, and the like.

As described in the foregoing, according to this invention, there can be achieved a structure in which characteristics of the surface optical device are not lowered when the surface optical device and the electronic device are integrated, where no high precision of alignment is required at the time of implementation, and whose productivity is high.

Except as otherwise disclosed herein, the various components shown in outline or block form in any of FIGS. 1–14 are individually well known in the optical device, electronic circuit devices, IC techniques, and optical printing systems arts, and their internal construction and operation are therefore not described herein.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A surface optical device apparatus comprising:

a surface optical device, said surface optical device including a functional layer grown on a first substrate, which acts as a supporting substrate needed for fabricating said functional layer thereon, said first substrate being thinned or removed after fabrication of said functional layer, and a first electrode formed on at least one of surfaces of said functional layer; and a second substrate, said second substrate including a second electrode formed thereon, and said surface optical device being bonded to said second substrate with said first electrode and said second electrode being in electrical contact with each other, wherein a plurality of said surface optical devices are arranged on said second substrate, and said second substrate further includes second electrical wiring for independently driving and controlling said surface optical devices, and wherein said first electrode is formed on the surface of said functional layer on a side opposite to the side of said first substrate, as a common electrode, the plurality of said surface optical devices are separated from each other, a third electrode is formed on each said surface optical device on the side of said first substrate, and said second electrical wiring is connected to each said third electrode.

2. A surface optical device apparatus, comprising:

a surface optical device, said surface optical device including a functional layer grown on a first substrate, which acts as a supporting substrate needed for fabricating said functional layer thereon, said first substrate being thinned or removed after fabrication of said functional layer, and a first electrode formed on at least one of surfaces of said functional layer; and a second substrate, said second substrate including a second electrode formed thereon, and said surface optical device being bonded to said second substrate with said first electrode and said second electrode being in electrical contact with each other, wherein a plurality of said surface optical devices are arranged on said second substrate, and said second substrate further includes second electrical wiring for independently driving and controlling said surface optical devices, wherein said first electrode is formed on the surface of said functional layer on a side opposite to the side of said first substrate, as a common electrode, the plurality of said surface optical devices are separated from each other, a third electrode is formed on each said surface optical device on the side of said first substrate, and said second electrical wiring is connected to each said third electrode, and wherein said second electrical wiring is formed on an insulating layer formed on said surface optical device on the side of said third electrode, and a contact hole for electrically connecting said third electrode to said second electrical wiring and a window for transmitting light are formed in said insulating layer.

3. A surface optical device apparatus of comprising:

a surface optical device, said surface optical device including a functional layer grown on a first substrate, which acts as a supporting substrate needed for fabricating said functional layer thereon, said first substrate being thinned or removed after fabrication of said functional layer, and a first electrode formed on at least one of surfaces of said functional layer; and a second substrate, said second substrate including a second electrode formed thereon, and said surface optical device being bonded to said second substrate with said first electrode and said second electrode being in electrical contact with each other, wherein a plurality of said surface optical devices are arranged on said second substrate, said surface optical devices are separated from each other, a third electrode is formed on each said surface optical device on a side opposite to said first electrode, said second substrate further includes first electrical wiring electrically connected to said second electrode and second electrical wiring electrically connected to said third electrode, and said first electrical wiring and said second electrical wiring construct a wiring matrix for independently driving and controlling said surface optical devices, and wherein said second electrical wiring is formed on an insulating layer formed on said surface optical device on the side of said third electrode, and a contact hole for electrically connecting said third electrode to said second electrical wiring and a window for transmitting light are formed in said insulating layer.

4. A surface optical device apparatus comprising:

a surface optical device, said surface optical device including a functional layer grown on a first substrate, which acts as a supporting substrate needed for fabricating said functional layer thereon, said first substrate being thinned or removed after fabrication of said functional layer, and a first electrode formed on at least one of surfaces of said functional layer; and a second substrate, said second substrate including a second electrode formed thereon, and said surface optical device being bonded to said second substrate with said first electrode and said second electrode being in electrical contact with each other, wherein said surface optical device comprises a surface emitting laser with said functional layer including an active layer and distributed Bragg reflector (DBR) mirror layers sandwiching said active layer.

5. An optoelectronic multi-chip module comprising:

a surface optical device, said surface optical device including a functional layer grown on a first substrate, which acts as a supporting substrate for fabricating said functional layer thereon, said first substrate being substantially thinned or removed after fabrication of said functional layer, and a first electrode formed on at least one of surfaces of said functional layer;

a second substrate, said second substrate including a second electrode formed thereon, and said surface optical device being bonded to said second substrate with said first electrode and said second electrode being in electrical contact with each other; and an integrated circuit for driving and controlling said surface optical device, said integrated circuit being provided on said second substrate, and being electrically connected to said surface optical device through said second electrode.

6. The optoelectronic multi-chip module of claim 5, wherein said integrated circuit comprises a bare chip of a Si integrated circuit which is implemented on said second substrate in a flip-chip manner.

7. The optoelectronic multi-chip module of claim 5, wherein said second substrate comprises a Si substrate, and said integrated circuit comprises a Si integrated circuit which is fabricated in said Si substrate.

8. An optical wiring device comprising:

a surface optical device, said surface optical device including a functional layer grown on a first substrate, which acts as a supporting substrate for fabricating said functional layer thereon, said first substrate being substantially thinned or removed after fabrication of said functional layer, and a first electrode formed on at least one of surfaces of said functional layer;

a second substrate, said second substrate including a second electrode formed thereon, and said surface optical device being bonded to said second substrate with said first electrode and said second electrode being in electrical contact with each other;

an integrated circuit for driving and controlling said surface optical device, said integrated circuit being provided on said second substrate, and electrically connected to said surface optical device through said second electrode; and an optical waveguide medium, said optical waveguide medium being fixed to the surface of said surface optical device to perform optical transmission and reception through said optical waveguide medium.

9. The optical wiring device of claim 8, wherein said integrated circuit comprises a bare chip of a Si integrated circuit which is implemented on said second substrate in a flip-chip manner.

10. The optical wiring device of claim 8, wherein said second substrate comprises a Si substrate, and said integrated circuit comprises a Si integrated circuit which is fabricated on said Si substrate.

11. The optical wiring device of claim 8, wherein said optical waveguide medium comprises an optical fiber.

12. The optical wiring device of claim 8, wherein said optical waveguide medium is fixed to the surface of said surface optical device with a resin adhesive.

13. A multi-layer optoelectronic multi-chip module comprising:

(a) a plurality of optoelectronic multi-chip modules, each said optoelectric multi-chip module including:

a surface optical device, said surface optical device including a functional layer grown on a first substrate, which acts as a supporting substrate for fabricating said functional layer thereon, said first substrate being substantially thinned or removed after fabrication of said functional layer, a first electrode formed on at least one of the surfaces of said functional layer; and an integrated circuit for driving and controlling said surface optical device, said integrated circuit being provided in the same plane as the plane in which said surface optical device is provided and being electrically connected to said surface optical device through said first electrode; and (b) an inter-layer insulating layer, said insulating layer being flattened and provided between said optoelectronic multi-chip modules, such that the transmission and reception of an optical signal can be performed between said optoelectronic multi-chip modules.

14. A multi-layer optoelectronic multi-chip module comprising:

(a) a plurality of optoelectronic multi-chip modules, each said optoelectric multi-chip module including:

a surface optical device, said surface optical device including a functional layer grown on a first substrate, which acts as a supporting substrate for fabricating said functional layer thereon, said first substrate being substantially thinned or removed after fabrication of said functional layer, a first electrode formed on at least one of the surfaces of said functional layer;

a second substrate of an insulating thin film, said second substrate including a second electrode formed thereon, and said surface optical device being bonded to said second substrate, with said first electrode and said second electrode being in electrical contact with each other; and an integrated circuit for driving and controlling said surface optical device, said integrated circuit being provided on said second substrate, and electrically connected to said surface optical device through said second electrode; and (b) an inter-layer insulating layer, said insulating layer being provided between said optoelectronic multi-chip modules, such that transmission and reception of an optical signal can be performed between said optoelectronic multi-chip modules.

15. The multi-layer optoelectronic multi-chip module of claim 14, wherein said integrated circuit comprises a bare chip of a Si integrated circuit which is implemented on said second substrate in a flip-chip manner.

16. The multi-layer optoelectronic multi-chip module of claim 14, wherein said second substrate comprises a Si thin substrate, and said integrated circuit comprises a Si integrated circuit which is fabricated on said Si substrate.

17. An optical recording apparatus comprising:

(a) an optoelectronic multi-chip module as a light source, said optoelectric multi-chip module including:

a plurality of surface emitting lasers, each said surface emitting laser including a functional layer grown on a first substrate, which acts as a supporting substrate for fabricating said functional layer thereon, said first substrate being substantially thinned or removed after fabrication of said functional layer, a first electrode formed on at least one of surfaces of said functional layer;

a second substrate, said second substrate including a second electrode formed thereon, and said surface optical device being bonded to said second substrate, with said first electrode and said second electrode being in electrical contact with each other; and an integrated circuit for driving and controlling said surface emitting laser, said integrated circuit being provided on said second substrate, and electrically connected to said surface emitting laser through said second electrode; and (b) control means for controlling said light source to perform recording on an optical recording medium with a plurality of laser beams from said light source.

* * * * *

UNITED STATES PATENT AND TRADEMARK OFFICE
CERTIFICATE OF CORRECTION

PATENT NO. : 6,836,579 B2
DATED : December 28, 2004
INVENTOR(S) : Toshihiko Ouchi It is certified that error appears in the above-identified patent and that said Letters Patent is hereby corrected as shown below:

Column 4,
Line 66, "includ-" should read -- includes --; and
Line 67, "ing" should be deleted.

Column 8,
Line 15, "passibation" should read -- passivation --; and
Line 20, "ployimide" should read -- polyimide --.

Column 12,
Line 62, "inidicated" should read -- indicated --.

Column 13,
Line 18, "has" should read -- have --.

Column 15,
Line 12, "be functioned" should read -- function --.

Signed and Sealed this

Twenty-eighth Day of June, 2005

JON W. DUDAS
*Director of the United States Patent and Trademark Office*